(12) United States Patent
Koli

(10) Patent No.: US 8,274,418 B2
(45) Date of Patent: Sep. 25, 2012

(54) ANALOGUE-TO-DIGITAL CONVERTER

(75) Inventor: Kimmo Koli, Helsinki (FI)

(73) Assignee: Nokia Corporation, Espoo (FI)

( * ) Notice: Subject to any disclaimer, the term of this patent is extended or adjusted under 35 U.S.C. 154(b) by 367 days.

(21) Appl. No.: 12/600,673

(22) PCT Filed: May 18, 2007

(86) PCT No.: PCT/IB2007/051904
§ 371 (c)(1),
(2), (4) Date: Nov. 18, 2009

(87) PCT Pub. No.: WO2008/142486
PCT Pub. Date: Nov. 27, 2008

(65) Prior Publication Data
US 2010/0151900 A1    Jun. 17, 2010

(51) Int. Cl.
*H03M 1/12* (2006.01)
(52) U.S. Cl. ......... 341/155; 341/172; 341/163; 341/161
(58) Field of Classification Search ................... 341/155, 341/172, 163, 161
See application file for complete search history.

(56) References Cited

U.S. PATENT DOCUMENTS

| | | | |
|---|---|---|---|
| 7,039,464 B2 * | 5/2006 | Stessman | 607/27 |
| 7,129,882 B2 * | 10/2006 | Yukawa | 341/163 |
| 2005/0032540 A1 * | 2/2005 | Lee et al. | 455/522 |
| 2007/0035434 A1 * | 2/2007 | Tachibana et al. | 341/161 |

FOREIGN PATENT DOCUMENTS

| | | |
|---|---|---|
| WO | WO 01/24192 A1 | 4/2001 |
| WO | WO 2004/010586 A2 | 1/2004 |
| WO | WO 2005/031755 A1 | 4/2005 |
| WO | WO 2007/005392 A1 | 1/2007 |

OTHER PUBLICATIONS

Uster, M., "Current-Mode-Analog-to-Digital Converter for Array Implementation", 2003, Swiss Federal Institute of Technology Zurich, relevant pages, 12 pages.

* cited by examiner

*Primary Examiner* — Jean B Jeanglaude
(74) *Attorney, Agent, or Firm* — Harrington & Smith

(57) ABSTRACT

An analogue to digital converter uses charge sampling in combination with a successive approximation conversion technique in order to combine anti-alias filtering and quadrature downconversion functions into the data converter. The conversion method is an energy-efficient realization for wideband radio systems with moderate resolution specifications such as 4G or ultra-wideband radio (UWB). The converter uses two capacitor matrices, one to perform charge sampling, and one to be used simultaneously in the successive approximation technique, so that full use of an input signal is made and efficiency is maximized.

31 Claims, 8 Drawing Sheets

ANALOGUE-TO-DIGITAL CONVERTER

CROSS-RELATED APPLICATIONS

This application is a 35 U.S.C. §371 application of International PCT Application No. PCT/IB2007/051904, filed on May 18, 2007.

FIELD OF THE INVENTION

The present invention relates to the field of analogue-to-digital conversion and particularly, but not exclusively, to an analogue to digital converter and corresponding method which can be used in a radio receiver.

BACKGROUND OF THE INVENTION

Two of the main operations performed by analogue circuitry in a radio application are filtering and analogue to digital (A/D) conversion. A/D conversion enables a received analogue signal to be digitised so that digital signal processing techniques can be performed on it. Accordingly, an A/D converter (ADC) must be carefully designed so that the digitised signal is a sufficiently faithful approximation to the analogue signal if high quality performance is to be achieved.

The two basic elements required in an ADC are a sampler for sampling an analogue input signal, and a mechanism for comparing the sampled signal with quantized voltage levels and selecting the closest matching level as the digital output voltage.

The criteria which are taken into account in the design stage are the sampling rate, which determines the amount of the input signal to which the conversion process can be applied, and the resolution of the converter, which determines the number of digital voltage levels which can be used to represent the input signal. Clearly the higher the sampling rate and the higher the resolution, the more faithful the conversion of the signal will be. The required sampling rate will be related to the A/D conversion bandwidth which is needed for a particular application.

SUMMARY OF THE INVENTION

Embodiments of the present invention aim to provide an improved ADC which is suitable for use in radio applications, particularly those which support a number of radio standards requiring different signal bandwidths.

According to an aspect of the present invention, there is provided a method of converting an analogue signal to a digital signal comprising converting an input analogue voltage signal to a current signal, applying the current signal to a charge-storage means during a sampling period, performing approximation of a voltage derived from charge stored during the sampling period by determining one of a successively smaller range of voltages which corresponds to the derived voltage, and outputting a digital signal corresponding to the approximated voltage.

The method comprises charge sampling in combination with using a successive approximation ADC.

The method may comprise alternately applying the current signal to a first charge-storage means and a second charge-storage means, wherein the approximation of a voltage derived from charge stored in the first charge-storage means is performed while the current signal is applied to the second charge-storage means. This enables continuous sampling of the input current signal, so that none of the signal is wasted.

The method may comprise downconverting the current signal to reduce the frequency at which the conversion is performed, thus relaxing the circuitry requirements.

The method may comprise applying the current signal to the first charge-storage means of each of a plurality of pairs of charge-storage means, and approximating the voltages derived from charge stored in each first charge-storage means while the current signal is applied to the respective second charge-storage means of each of the plurality of pairs of charge-storage means, wherein the sampling periods associated with the pairs of charge-storage means are out of phase with respect to each other. This increases the bandwidth of the A/D conversion. It also enables downconversion to be performed at finer than 90° resolution, and causes harmonic rejection mixing, thus relaxing RF bandpass filtering requirements before downconversion.

Downconversion may be performed of the digital output signals in order to relax the circuitry requirements of performing downconversion in the analogue domain prior to sampling.

The sampling may comprise filtering having notches in the transfer function which can be arranged to reject unwanted frequencies, for example.

The sampling may also be arranged to perform anti-aliasing filtering.

The approximation may comprise dithering to increase the available resolution of the converter.

According to another aspect of the present invention, there is provided an apparatus for performing analogue-to-digital conversion, comprising means for converting an input analogue voltage signal to a current signal, means for storing charge carried by the current signal during a sampling period, means for performing approximation of a voltage derived from the charge stored during the sampling period by determining one of a successively smaller range of voltage levels which corresponds to the derived voltage, and means for outputting a digital signal corresponding to the approximated voltage.

The charge storage means may comprise a matrix of one or more capacitors arranged in parallel. Such an implementation is simple to achieve using CMOS technology.

The technique used in embodiments of the present invention is capable of combining anti-alias filtering and quadrature downconversion functions with the A/D conversion, leading to enhanced performance. The technique is particularly applicable to software-defined radio (SDR) where a number of communications protocols can be employed by modifying various aspects of the control software of the radio.

BRIEF DESCRIPTION OF THE DRAWINGS

Embodiments of the present invention will now be described by way of example only, and with reference to the accompanying drawings, in which.

DETAILED DESCRIPTION OF THE EMBODIMENTS

Figure 1A:
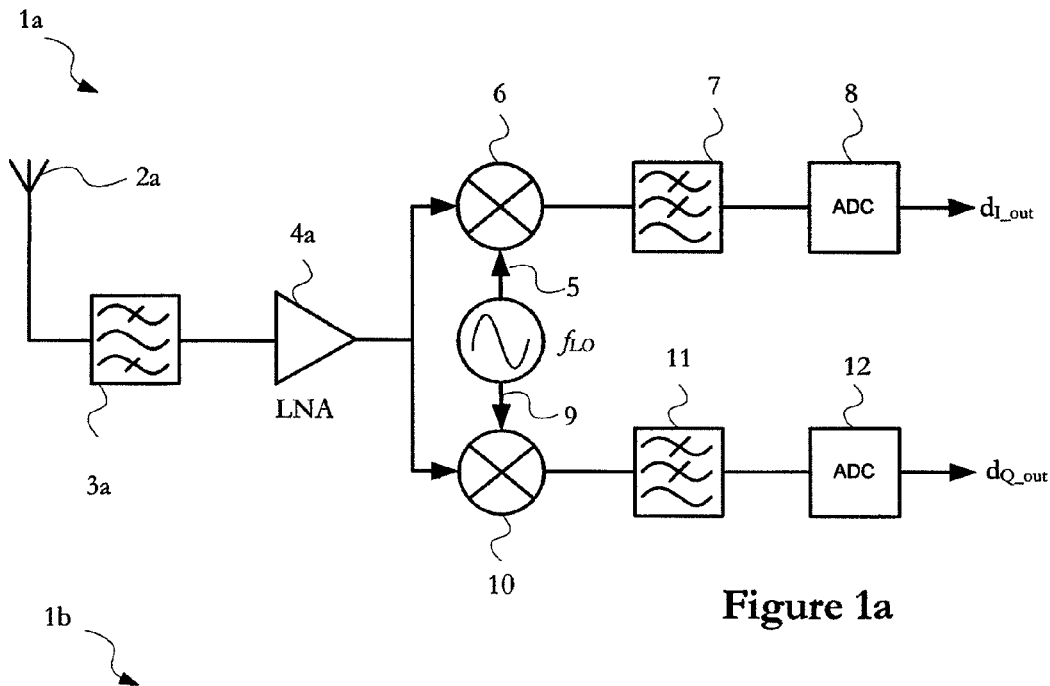
FIGS. 1a, 1b and 1c are schematic representations of a radio receiver containing an ADC according to embodiments of the present invention.
Figure 1B:
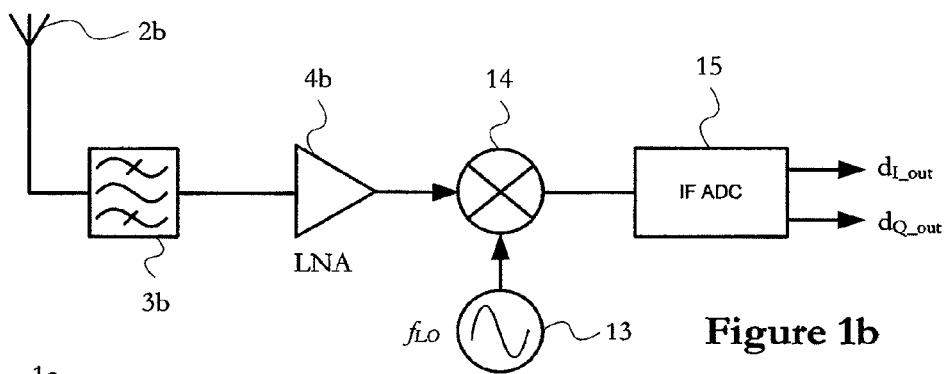
Figure 1C:
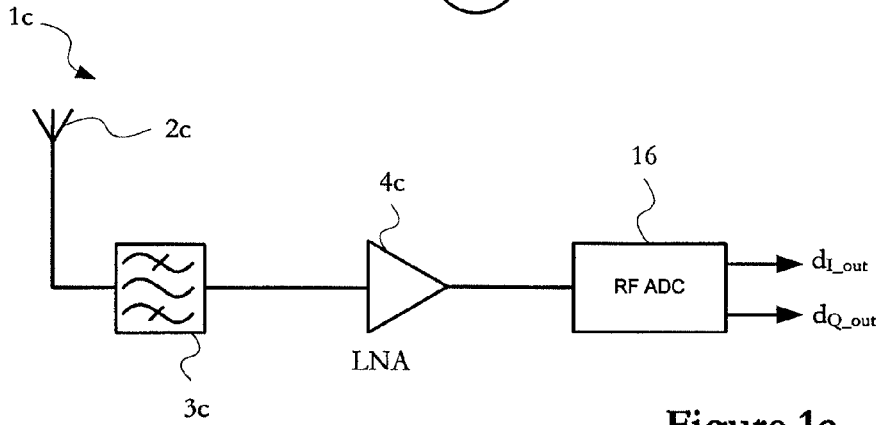

FIGS. 1a, 1b and 1c show three embodiments of a radio receiver employing an ADC according to the present invention. In each case, the radio 1a, 1b, 1c has an antenna 2a, 2b, 2c for receiving radio frequency (RF) signals in a number of signal bandwidths, which have been modulated by frequency modulation, analogue modulation, phase modulation or the like. The received signals are passed through a bandpass filter 3a, 3b, 3c in each embodiment, in order to select a received signal of a particular frequency, and a low noise amplifier 4a, 4b, 4c, before demodulation is performed.

In modern radio receivers, an increasing part of channel filtering, and all demodulation, is done in the digital domain, and accordingly A/D conversion of the filtered and amplified signal is the next step which is performed.

In the embodiment of FIG. 1a, quadrature downconversion of the filtered signal is performed by mixing the signal with two local oscillator signals 5, 9 which have the same frequency $f_{LO}$ but are 90° out of phase with respect to each other. One of the mixers 6 is located in the "in-phase" branch of the system, where the mixer 6 is driven directly by local oscillator signal 5, while the other mixer 10 is in the "quadrature" branch, where the second mixer 10 is driven with a 90 degrees phase shifted local oscillator signal 9. Each mixer 6, 10 produces sum and difference frequency signals, and the outputs are low-pass filtered 7, 11 to reject the summed frequency component, and pass the lower difference frequency component, which is applied to a baseband ADC 8, 12. The in-phase ADC 8 outputs a digital output signal $d_{I\_out}$ (the "real component") while the quadrature ADC 12 outputs digital output signal $d_{Q\_out}$ (the "imaginary component").

In the embodiment of FIG. 1b, the ADC is operated at an intermediate frequency (IF) and a superheterodyne architecture is used. The ADC has an local oscillator 13 positioned before it with an IF signal of frequency $f_{LO}$ and a mixer 14. The ADC 15 produces both in-phase and quadrature outputs, as will be described below with reference to FIG. 4.

In the embodiment of FIG. 1c, the ADC is used in a direct conversion system with RF operation, and so either there is no frequency mixing, or it is performed inside the ADC 16.

In each embodiment described above, the ADC has two components—a sampler and a conversion module. The ADC performs digitisation of the signal so that a sequence of digital output signals is produced, each of which corresponds to an estimated instance of the input analogue signal. The digital signal can be fed to a digital signal processor where further processing can be performed as required. The processing may result in the output of a sound signal via a speaker, for example, or in the output of data in the form of displayed information.

Figure 2:
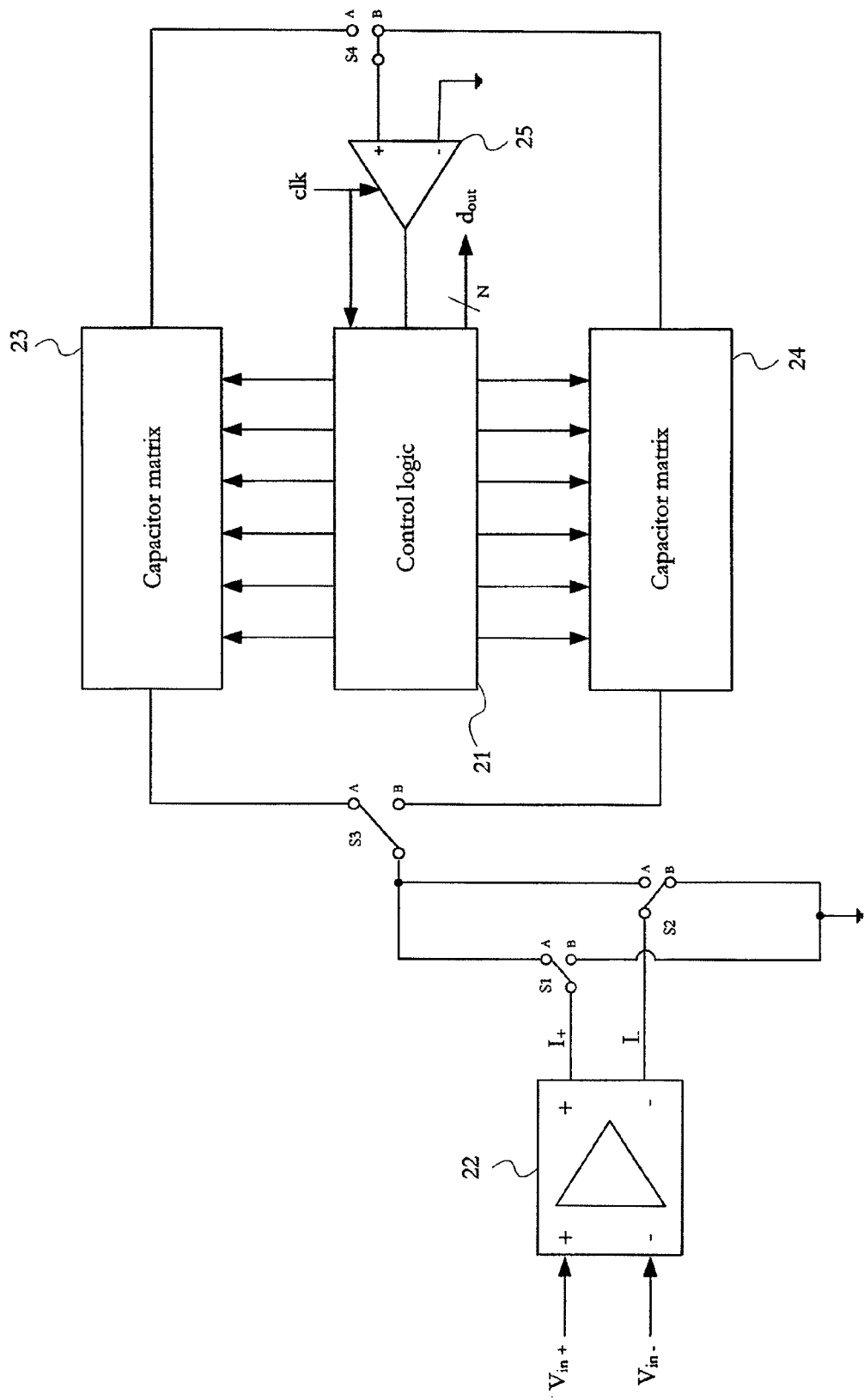
FIG. 2 is a schematic representation of an ADC according to an embodiment of the present invention.

Referring to FIG. 2, there is shown a schematic diagram of the components of an ADC according to an embodiment of the present invention. Conversion of the voltage difference between two differential analogue inputs $V_{in+}$ and $V_{in-}$ is performed, under the control of the control logic 21, into an N-bit serial output $d_{out}$. The digital output signal $d_{out}$ is output over a digital bus as the conversion happens bit by bit, MSB being the first bit. The control logic 21 takes the form of a microcontroller, including a successive approximation register (SAR) and a clock oscillator, as will be described in more detail below.

In this embodiment, the differential input voltage is applied to a transconductance amplifier 22, which converts it into differential output currents $I_+$ and $I_-$. The amplifier 22 has transconductance $G_m$, so that the output current $I_+ = G_m(V_{in+} - V_{in-})$ for differential input voltages $V_{in+}$ and $V_{in-}$, and $I_- = -I_+$. In this embodiment, the input is of intermediate frequency, downmixed from RF in the radio receiver. It will of course be appreciated that the received signal could itself be an RF signal, and there are several radio standards which use frequencies low enough to skip the intermediate frequency conversion step altogether.

The use of differential signals is advantageous as disturbances can be effectively suppressed, and the voltage swing which is ultimately obtained from the ADC can be doubled. In addition, even order non-linearities can be rejected.

The currents produced by the transconductance amplifier 22 are then downmixed via switches S1 and S2, which are controlled to alternate states on the application of a clock signal. Switch S3 controls routing of the current signal to one of two capacitor matrices 23, 24. With switches S1 and S3 in position A, and S2 in position B, $I_+$ is routed to a first capacitor matrix 23, while $I_-$ is routed to ground. Similarly, with S1 and S3 in position B, and S2 in position A, $I_+$ is routed to ground, while $I_-$ is routed to a second capacitor matrix 24.

The capacitor matrices 23, 24 each contain a network of capacitors, each of which accumulates a time-varying charge when a current is applied to the matrix. The charge which is stored over a period of time is determined by integrating the current applied to a capacitor matrix 23, 24 over a sampling period. This technique will be referred to as "charge sampling". Using the relationship Q=CV, for charge Q, and capacitance C, a voltage V across the capacitors can be determined from the charge stored and the capacitance of the capacitor matrix 23, 24 storing it, as well as the known gain $G_m$ of the transconductance amplifier 22. The sampled voltage is then digitalised.

This sampling technique, as it involves integration, also acts as a low-pass filter as the impedance of the integrating capacitors at the output stage approaches zero at high frequencies, meaning that voltage across them also tends to zero.

If charge sampling is modelled as an integral of current multiplied by a sequence of delta functions representing the samples taken, the delta functions being spaced by the period of the sampling cycle, it can be shown that the transfer function of the sampler corresponds to that of a sinc-type low-pass filter (where sinc(x)=sin(x)/x), having "notches" (zero amplitude) at integer multiples of the sampling frequency. The sinc-type filter transfer function can be modelled as a low-pass filter at low frequencies, and a comb filter beyond the corner frequency of the low-pass filter, the comb filter providing the notches at integer multiples of the sampling frequency.

The advantage of the sinc-type filtering is that noise folding and aliasing effects typically associated with sampling can be significantly reduced, as the transfer function of the filter can be controlled by appropriate selection of the sampling frequency so to as to position notches at frequencies which will eliminate these problems. For example, to satisfy the Nyquist sampling theorem, the sampling frequency must be greater than twice the bandwidth of the filter.

When the state of switch S3 is set to position B, so that the current from the transconductance amplifier 22 is no longer routed to the first capacitor matrix 23, the charge sampled by the first matrix 23 is used in conjunction with the control logic 21 and a comparator 25 to perform the A/D conversion as will be described below. As a result of the disconnection of this matrix 23 from an input, the charge stored is "held" so that the A/D-conversion can be performed. The A/D-conversion is performed during the time period in which current is integrated by the second matrix 24 (current being routed to this matrix 24 via switch S3). The use of two capacitor matrices 23, 24 therefore ensures that none of the input signal is wasted, as the sampler can effectively act on the full input signal, via one or other of the matrices 23, 24, while the A/D conversion is performed simultaneously with the sampling cycle.

The conversion technique performed in the present embodiment involves determining one of a successively smaller range of discrete voltage levels which corresponds to the derived voltage, and will be referred to as "successive approximation". The successive approximation technique used is useful as it combines relatively low power consumption with moderate silicon area. For an N-bit ADC, there are $2^N$ possible voltage levels which can be represented by a binary number containing N bits.

The sampled voltage obtained via the current integration is compared with a series of reference voltages in order to determine successively smaller ranges of voltages within which the sampled voltage lies. Mathematically, this is achieved by dividing of a voltage range into two equal halves, and comparing the input voltage with the dividing midpoint in order to determine the half of the range in which the input voltage lies. The determined half-range is then itself halved and the process is repeated.

As an example, consider an ADC which is capable of producing an output between zero and 20V. For the purposes of this example, the set of discrete voltage outputs corresponds to integer voltage values between zero and 20V. In the first iteration, the full range 0-20V is divided into two about the midpoint 10V, which is compared with an input voltage of 16V, for example. From this comparison, it can be determined that the input voltage lies within the range 10-20V. This new range is then divided about the midpoint 15V, and again compared with 16V. From this comparison it is determined that the input voltage lies within 15-20V, and so on.

The approximation becomes successively more accurate as the reference voltage range decreases in size. The resolution of the converter therefore depends on the size of the final range of reference voltages, which in turn depends on the number of comparisons performed.

In the circuit of FIG. 2, the approximation is performed using charge held by the first capacitor matrix 23 during the period in which a sampling cycle is performed by the second capacitor matrix 24, and vice-versa. Switch S4 is used to select an output of a capacitor matrix 23, 24 as the input of a comparator 25 which is used in the approximation process as described with reference to FIGS. 3a, 3b and 3c. In FIG. 2, S4 is in position B so that the second capacitor matrix 24 is used in the approximation cycle, while the first capacitor matrix 23 is used in sampling.

Figure 3A:
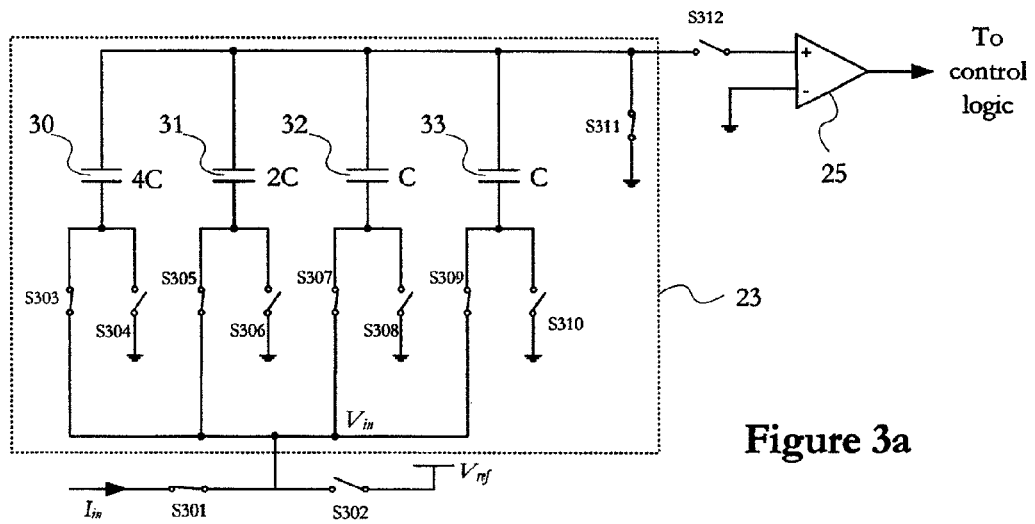
FIG. 3 is a schematic representation of the successive approximation architecture used in the ADC of FIG. 2.

FIG. 3a shows an example of the contents of a capacitor matrix 23 used in the ADC of FIG. 2. During the approximation, the capacitor matrix 23 shown acts as a 3-bit converter. The capacitor matrix 23 is shown as being switchably connected to the comparator 25 of FIG. 2 via switch S312. In the architecture of the ADC shown in FIG. 2, S312 corresponds to S4, which switches the input of the comparator 25 between the two capacitor matrix outputs.

The capacitor matrix 23 contains three binary weighted capacitors 30, 31, 32, i.e. capacitors whose capacitances are in the ratio of 4:2:1. A fourth capacitor 33, of equal capacitance to the smallest-value capacitor 32 in the series of three is included for mathematical reasons as will be described below.

In the configuration shown in FIG. 3a, the capacitor matrix 23 is in charge sampling mode. The input current $I_{in}$ is integrated by each of the four capacitors 30, 31, 32, 33 in parallel via for the duration of the sampling cycle by its application through switches S301, S303, S305, S307 and S309 to an "input" plate of each capacitor. The other plate of each capacitor 30, 31, 32, 33 is connected to ground via switch S311. Accordingly, each capacitor 30, 31, 32, 33 accumulates charge during the sampling cycle. The charge accumulated is distributed across the capacitor matrix 23, with a weighting of 4:2:1:1 by virtue of the relationship Q=CV, due to the capacitance weighting, and parallel arrangement of the capacitors 30, 31, 32, 33. The voltage which is accumulated on the input side of each capacitor 30, 31, 32, 33 is $V_{in}$.

Figure 3B:
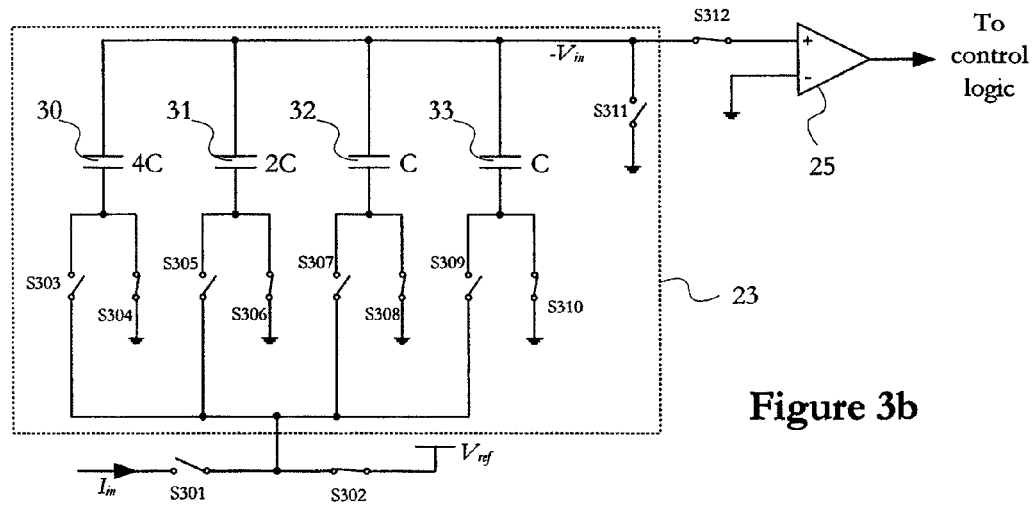
Figure 3C:
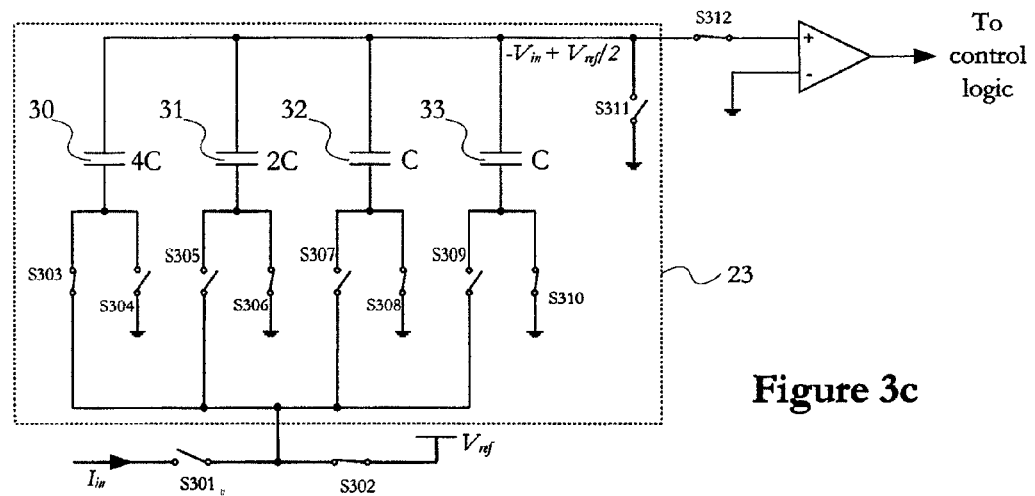

In the configuration shown in FIG. 3b, the capacitor matrix 23 is disconnected from the input current by the opening of switch S301. This corresponds to the switching of switch S3 at the end of the sampling cycle in FIG. 2 so that the capacitor matrix 23 is isolated from the input, and the second capacitor matrix 24 enters the sampling mode. This is the "hold" stage, of a "sample-and-hold" sampler, as the sampled voltage is held constant due to the absence of any more charge being accumulated from the input. In the hold stage, switches S303, S305, S307 and S309 are opened and switches S304, S306, S308 and S310 are closed so that the plates of the capacitors 30, 31, 32, 33 which were previously connected to $V_{in}$ are grounded. There is therefore a corresponding reduction of voltage $V_{in}$ on the opposing capacitor plates which were previously grounded, so these are now at voltage $-V_{in}$. Switch S311 is opened and switch S312 is closed so that the positive input of the comparator 25 sees an inverted sampled voltage $-V_{in}$. The negative input of the comparator 25 is grounded. The closing of the switch S312 corresponds to the moving of switch S4 in the circuit of FIG. 2 to position where the capacitor matrix output is connected to the comparator input.

As mentioned above, this capacitor matrix 23 serves as a 3-bit converter, i.e. it can convert an input into one of $2^3$ normalised levels. These eight levels correspond to the binary numbers 000, 001, 010, 011, 100, 101, 110, and 111. The capacitor 30 in the matrix having the highest capacitance can be referred to as the "most significant bit" (MSB) capacitor 30 as it is used in order to determine the MSB of the converted output. In the first conversion step, shown by FIG. 3c, the MSB capacitor 30 is connected to the reference voltage $V_{ref}$, supplied from the control logic 21, by closing switches S302 and S303. The resulting arrangement is a capacitor-based potential divider, whose output is the input at the comparator 25.

There are the four units of capacitance of the MSB capacitor 30 on one side of the divider, and there is a parallel combination of two units, one and one unit from the other three capacitors 31, 32, 33 between the comparator input and ground. As the parallel combination of these three capacitors 31, 32, 33 also has a total capacitance of four units, half of the reference voltage is fed to the comparator 25 by the dividing circuit. This voltage is of course in addition to the inverted sampled voltage $-V_{in}$ which is provided by the three non-MSB capacitors 31, 32, 33, so that the input to the comparator 25 is $V_{ref}/2-V_{in}$. The presence of the fourth capacitor 33 therefore ensures that the largest capacitor 30 is equal to the sum of all of the smaller capacitors 31, 32, 33 when arranged in parallel.

If the comparator output is positive, it is determined that $V_{in}>V_{ref}/2$, so that the sampled voltage lies in the upper half of the voltage range from 0 to $V_{ref}$. A positive result is recorded in the MSB of a successive approximation register (SAR) contained in the control logic 21 to which the capacitor matrix 23 is connected, and the binary values of 000, 001, 010 and 011 are therefore eliminated as potential conversion results.

Conversely, if the output is negative, it is determined that $V_{in}>V_{ref}/2$, so that the sampled voltage lies in the lower half of the voltage range from 0 to $V_{ref}$. A zero is recorded in the MSB of the SAR, thus eliminating 100, 101, 110, and 111 as potential conversion results.

If the comparator yielded a positive result, the MSB capacitor 30 is then grounded via switch S304 in the second conversion step. The second capacitor 31 is connected to $V_{ref}$ via switch S305, and switch S306 is opened. This arrangement is again a potential divider, with two units of capacitance between $V_{ref}$ and the input to the comparator, and four, one and one unit in parallel between the comparator input and ground. Accordingly, the input at the comparator 25 is $3V_{ref}/4-V_{in}$, as the six capacitance units between the comparator 25 and ground are ¾ of the total capacitance between the second capacitor input and ground.

The resulting comparison therefore determines whether $V_{in}$ lies between $V_{ref}/2$ and $3V_{ref}/4$, or between $3V_{ref}/4$ and $V_{ref}$. The result of the comparison is recorded in the second bit of the SAR.

It the comparator 25 yielded a negative result following the first conversion cycle, however, the MSB capacitor 30 is not grounded, and remains connected to $V_{ref}$ via switch S303. The second capacitor 31 is connected to $V_{ref}$ via switch S305 as above. Accordingly, the ratio of the capacitances in the potential divider arrangement is changed so that there are six units between the reference voltage input and the comparator input, and only two units between the comparator input and ground. The comparator input is thus $V_{ref}/4-V_{in}$, and the effect is to determine whether $V_{in}$ lies between zero and $V_{ref}/4$, or between $V_{ref}/4$ and $V_{ref}/2$.

In the third conversion cycle, the LSB is determined in the same way as described above, using the third capacitor 32 and an appropriate combination (depending on the previous conversion results) of the first 30 and second 31 capacitors. For an N-bit converter, there are N conversion cycles, having a duration of N clock cycles.

At the end of this conversion cycle, a 3-bit binary value is obtained which can be used to represent a digital value by appropriate scaling using the reference voltage $V_{ref}$. The value $d_{out}$ is output from the control logic 21.

After the N-bit digital value has been generated in the SAR, some residual charge remains in the capacitor matrix 23 from those capacitors which have not yet been grounded. This charge has to be reset by grounding these capacitors before the next charge sampling period begins, and thus a clock cycle will be need to be allocated to this process. Because of the charge reset cycle, it will in fact only be possible to perform N-bit A/D conversion with N+1 clock cycles of integration.

In all digitisation techniques, conversion error will result due to limitations imposed by the resolution of the ADC. For example, a two-bit converter may be unable to generate an exact binary value corresponding to an input of 1.2V for example, if it can only generate integer values for its voltage output. It may output 1V, which is 0.2V too low, or 2V which is 0.8V too high.

In practice, it is not necessary to fully reset the conversion error, however, as it simply acts as a dither signal for the converter which is useful in the prevention of non-linear behaviour in the conversion process. The principle is that over a period of time, the sense of the conversion error will average to zero, there being an equal chance that the quantized voltage output is too high or too low in comparison with the analogue input, and so systematic conversion errors (constantly rounding up, for example, rather than down) can be avoided.

In the embodiments described, a portion of the capacitors in the capacitor matrix 23 can be left floating during the reset phase so that there is a small amount of charge from the last conversion remaining and this remaining charge can be utilized as a pseudo-random dither signal. For example, the dithering could be achieved by leaving switch 310 open while S304, 306 and 308 are closed. Alternatively, S308 could also be left open to ensure adequate dithering. The exact number of capacitors grounded would depend on the desired level of dithering.

The dynamic range of the ADC can be increased by oversampling (sampling at a greater rate then the sample rate of the input signal) as a result of this embedded dithering. Increasing the sampling rate improves the signal to quantization error ratio as the error is effectively spread over a wider frequency range. It can be shown that quadrupling the sampling rate while keeping the signal bandwidth constant will have the effect of adding one bit more resolution to the converter, and so oversampling with dithering is particularly useful where the input signal would otherwise be smaller than the least significant bit value of the ADC.

Once the reset phase has been completed, the states of the switches are changed so that the arrangement of FIG. 3a is obtained again. As shown in FIG. 2, this corresponds to changing the state of switch S3 so that the first capacitor matrix 23 acts in sampling mode once again for a new sampling period. The second capacitor matrix 24 is then used in an approximation operation as discussed above, based on the charge which was obtained by integration during the period in which the previous approximation was carried out using the first capacitor matrix 23.

The comparator 25 used in the conversion process can be part of the control logic circuitry 21, implemented in a microcontroller, or can be implemented separately. In either case, only one comparator 25 is required, as only one capacitor matrix 23, 24 is associated with the conversion process at a time. Furthermore, only one control logic module 21 is required as it performs the same function regardless of the capacitor matrix 23, 24 from which it receives its input.

All components of the system, including the SAR, are clocked with reference to the same clock signal clk, which can be provided from the control logic 21. If the clock signal has a frequency $f_{clk}$, for (N−1)-bit A/D conversion, the sampling rate of the ADC, $f_{smpl}$, is $f_{clk}/N$.

As described above, while one of the capacitor matrices 23, the control logic 21, and the comparator 25 perform (N−1)-bit A/D conversion in N clock cycles, the other capacitor matrix 24 integrates N clock cycles of downmixed input current. Switches S3 and S4 control which capacitor matrix 23, 24 is used in charge sampling and which is used in successive approximation, and accordingly are controlled to operate at $f_{smpl}$.

Switches S1 and S2 perform signal downconversion, which may occur at an integer multiple M of the sampling frequency, i.e. a frequency of $Mf_{smpl}=Mf_{clk}/N$. If the downmixing is done from the sampling frequency $f_{smpl}$, i.e. $f_{smpl}=f_{clk}/N$, a single-ended input current can be used and switches S1 and S2 in FIG. 2 can be omitted, and the downmixing is actually performed in digital domain by changing the sign of the digital output of the A/D-conversion performed with the second capacitor matrix 24. In this case, downconversion only occurs if the signal charge sampled in the second capacitor matrix 24 is inverted with respect to the sampled signal in the first capacitor matrix 23, otherwise the two capacitor matrices 23, 24 only perform "double sampling" i.e. parallel circuitry is used to double the bandwidth of the output signal without any frequency mixing.

Figure 4:
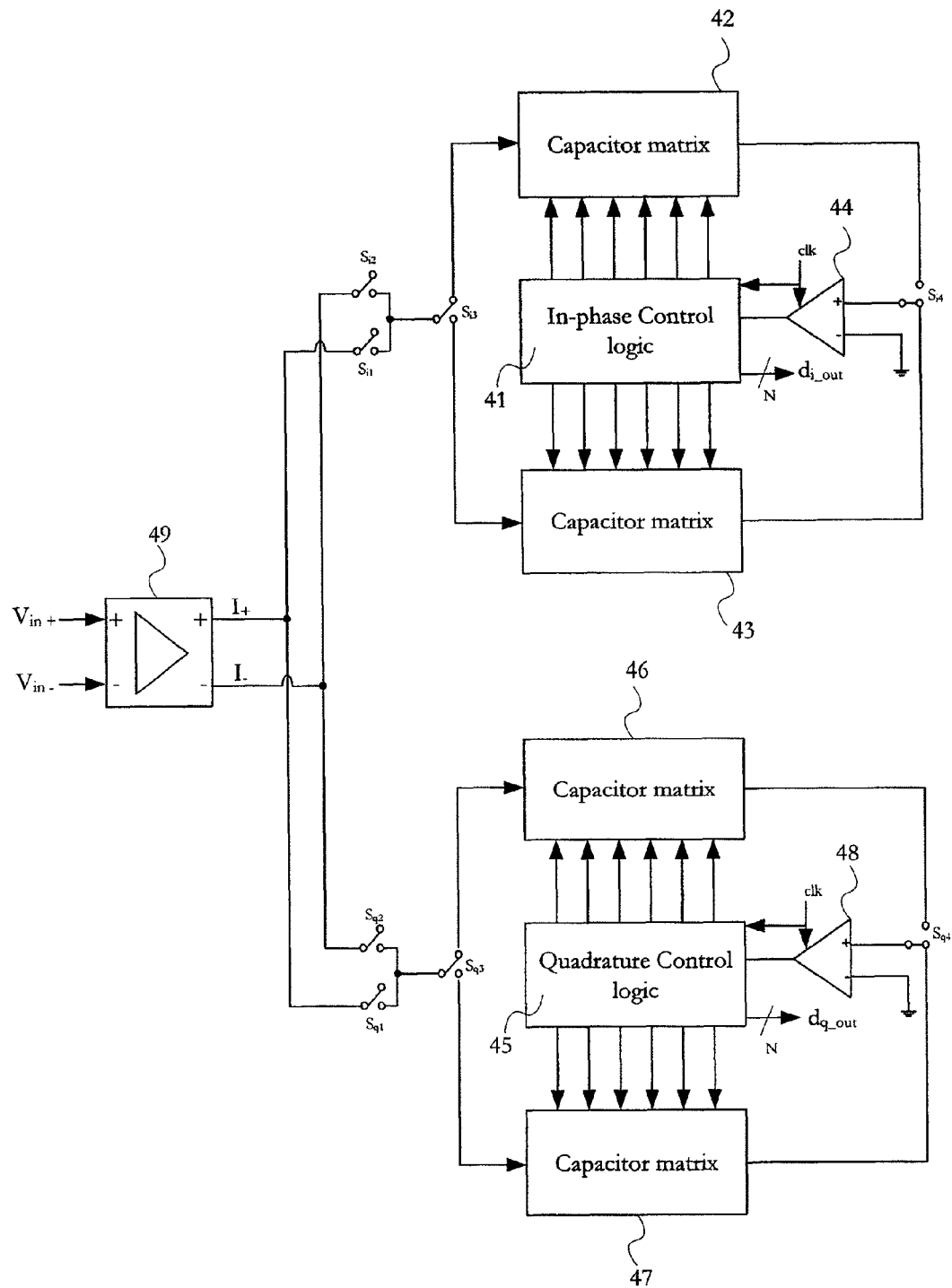
FIG. 4 is a schematic representation of an ADC according to a further embodiment of the present invention.

A further embodiment of the present invention is shown in FIG. 4. This embodiment uses four capacitor matrices 42, 43, 46, 47 and two comparators 44, 48. Only one differential transconductance amplifier 49 is used, as in the previous embodiment, but with a different switching arrangement and control signals.

As above, the transconductance amplifier 49 generates two currents signals, $I_+$ and I. By controlling the timing at which these current signals are input to the capacitor matrices 42, 43, 46, 47, it is possible to downconvert "in-phase" (I) and "quadrature" (Q) signals, which are separated by a 90° phase difference. In the arrangement of FIG. 4, the upper two capacitor matrices 42, 43 act in phase with the clock for the downconversion period, while the lower two matrices 46, 47 act in quadrature to it. The control logic 41, 45 for each pair of matrices 42, 43, 46, 47 outputs digitised voltage sequences $d_{i\_out}$ and $d_{q\_out}$, which are separated by 90° phase difference.

Figure 5:
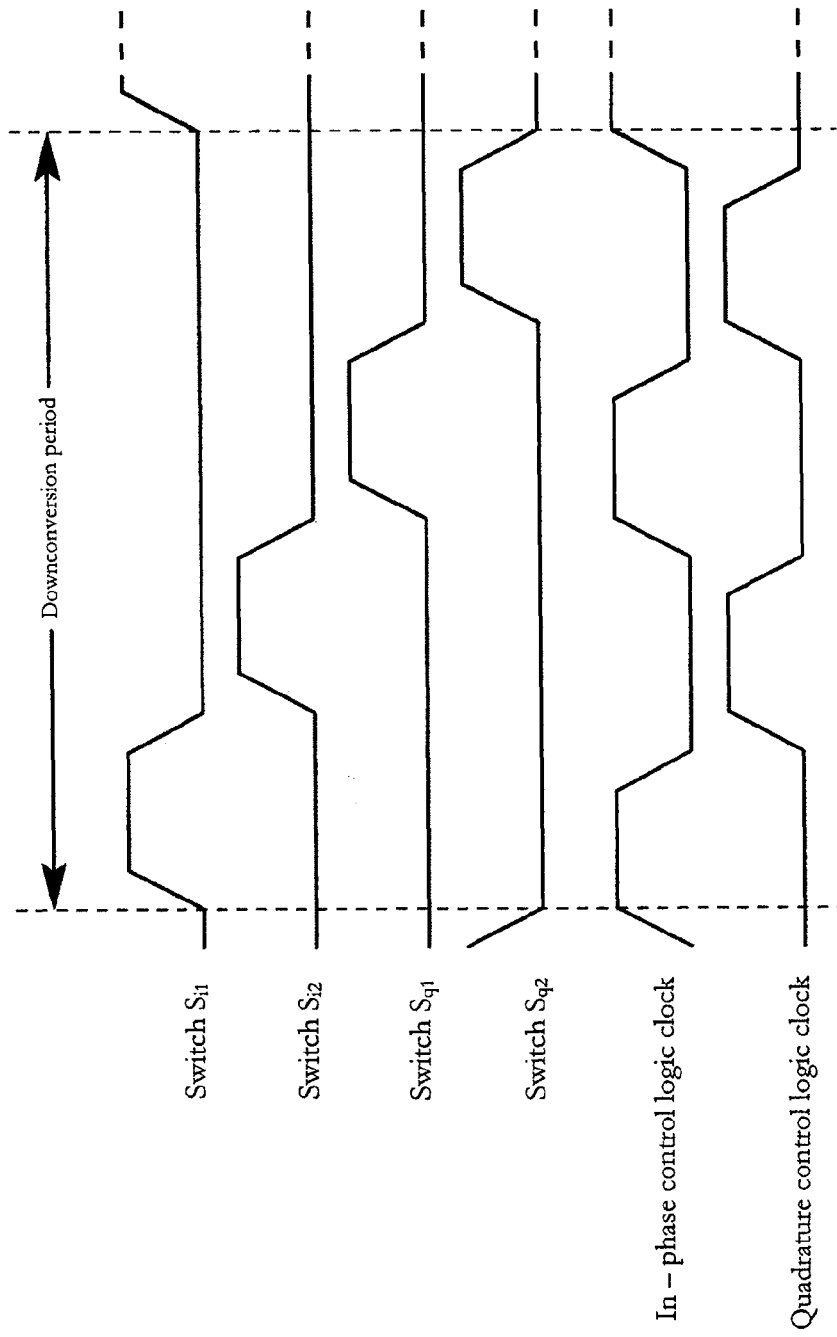
FIG. 5 is a timing diagram of the operation of the ADC of FIG. 4.

The clock signals and downmixing switching waveforms which are used are depicted in FIG. 5. The downconversion period is effectively divided into four sub-periods.

When the clock and downmixing signals are as depicted in FIG. 5, for (N−1)-bit A/D conversion, N downconversion periods are integrated first to capacitor matrices 42 and 46 and after that another N downconversion periods are integrated to capacitor matrices 43 and 47. Therefore downmixing happens from $f_{clk}$ to d.c. Of course, the local oscillator frequency can be a different integer multiple of the inverse of the charge sampling period i.e. $Mf_{clk}/N$ as in earlier cases.

In the first and third sub-periods of a downconversion period, $I_+$ and $I_-$ are applied to one of the pair of in-phase capacitor matrices 42 respectively for sampling. These input currents are therefore denoted as $I_{i+}$ and $I_{i-}$ respectively. Similarly, in the second and fourth sub-periods, the $I_+$ and $I_-$ are applied to one of the pair of quadrature capacitor matrices 46 respectively for sampling. These input currents are therefore denoted as $I_{q+}$ and $I_{q-}$ respectively. The application of the current is controlled by applying switching signals to switches $S_{i1}$, $S_{i2}$, $S_{q1}$, and $S_{q2}$ from the control logic modules 41, 45.

When a sampling period is completed after N downconversion cycles, the switches $S_{i3}$ and $S_{q3}$ are toggled so that the all currents are input to the other 43, 47 of their respective capacitor matrix pairs, analogously to the operation in the previous embodiment. Similarly, the output switches $S_{i4}$, and $S_{q4}$ are also toggled so that the sampling capacitor matrices 42, 46 are now used in successive approximation calculations, as discussed above.

Figure 6:
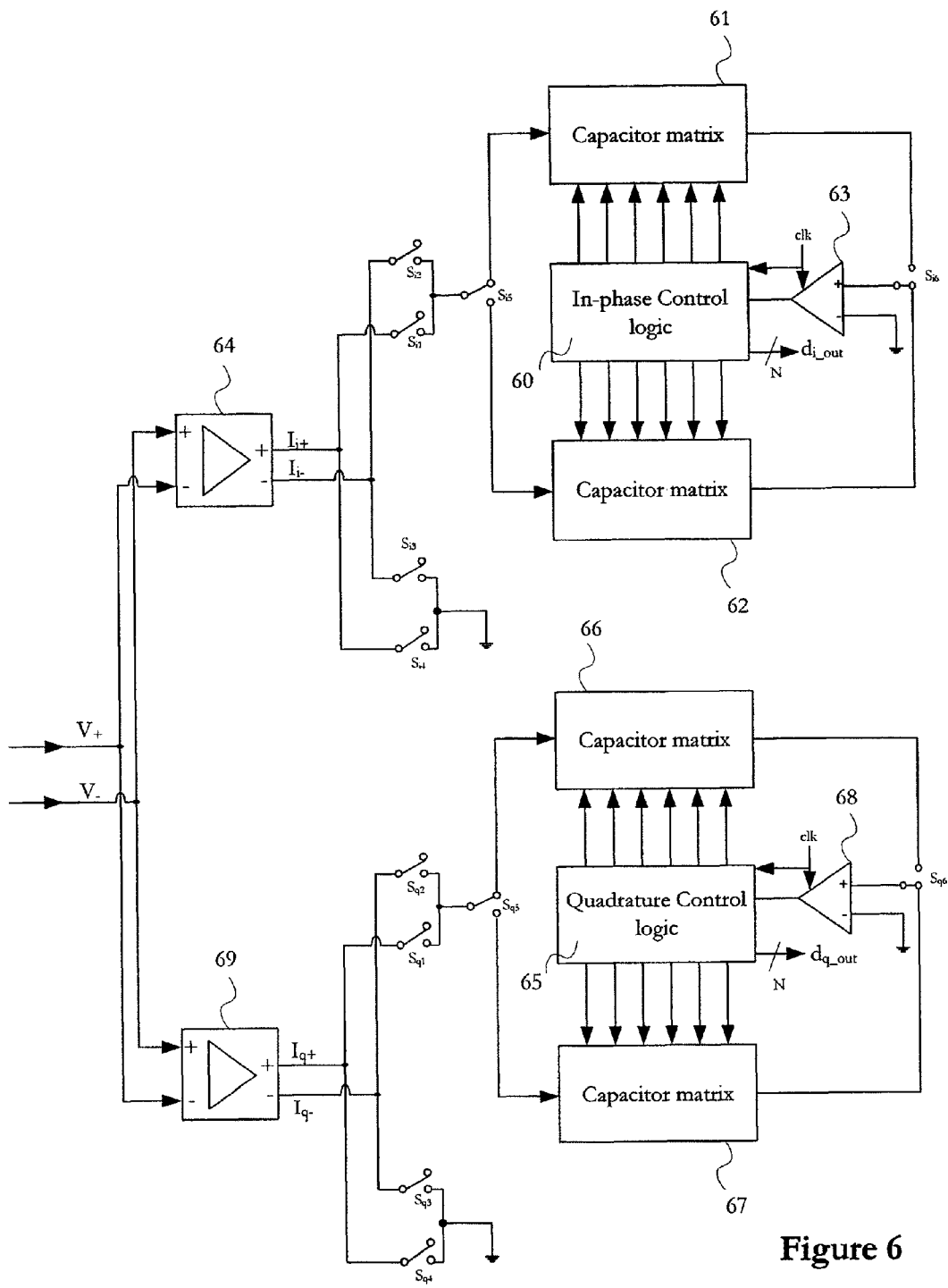
FIG. 6 is a schematic representation of an ADC according to a further embodiment of the present invention.
Figure 7:
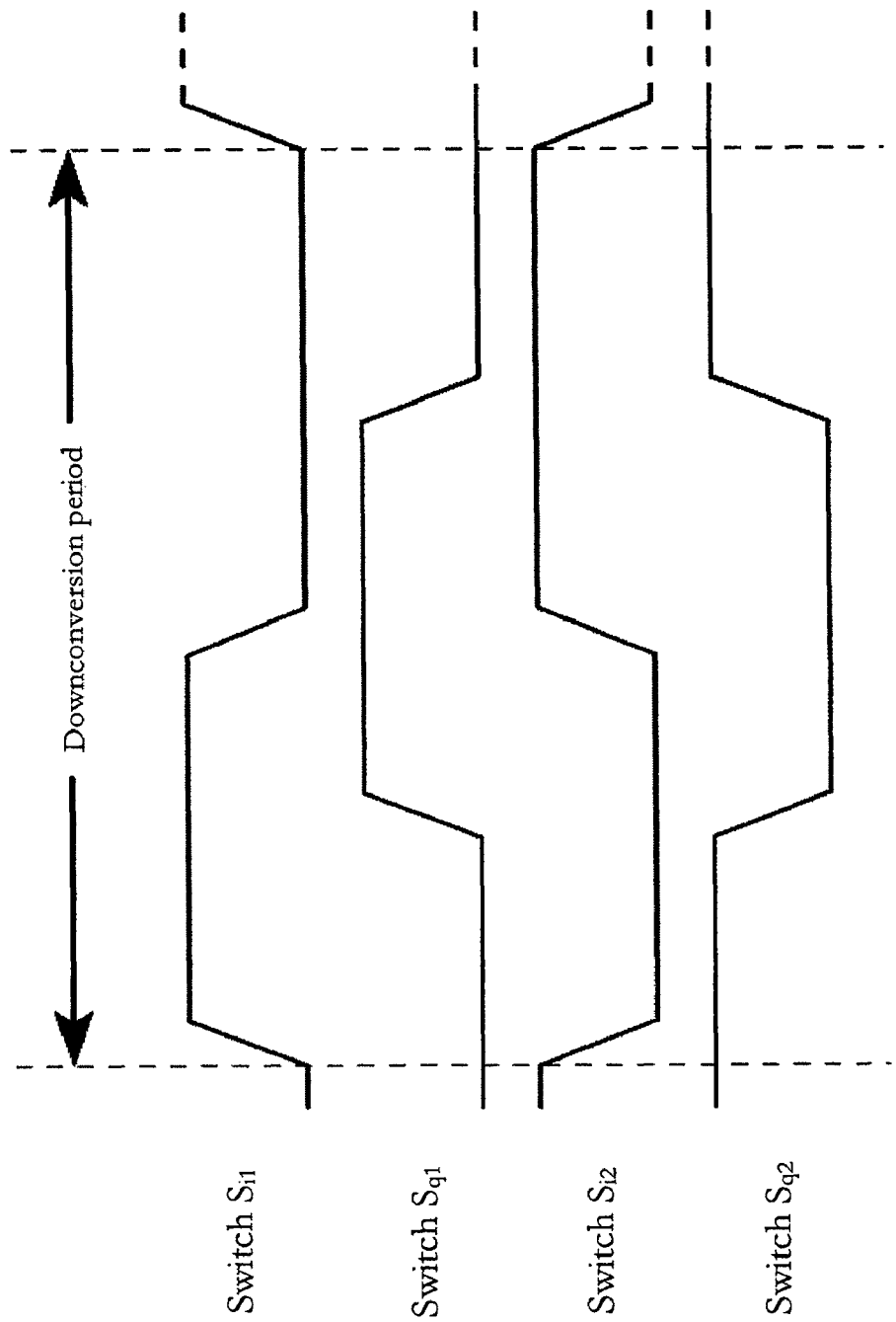
FIG. 7 is a portion of a timing diagram of the operation of the embodiment of FIG. 6.

In a further embodiment, shown in FIG. 6, two identical differential transconductors 64, 69 are used. The circuit is otherwise of the same layout as FIG. 4, having two comparators 63, 68 and four capacitor matrices 61, 62, 66, 67 and will not be described further. FIG. 7 shows a portion of a timing diagram of the switching signals from the control logic modules 60, 65 used in the embodiment of FIG. 6. The timing diagram differs from that used in FIG. 5 because of the overlap of, for example, the $S_{i1}$ and the $S_{q1}$ switch activities, which is made possible by the use of the second transconductance amplifier.

As with the FIG. 4 embodiment, there is a 90° phase difference between the downconversion periods of the two ADC pairs.

Figure 8:
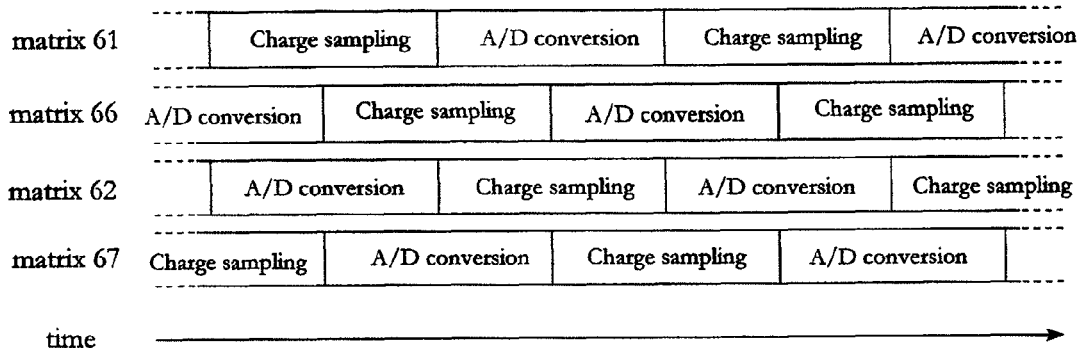
FIG. 8 shows the activity of the capacitor matrices of the embodiment of FIG. 6.

FIG. 8 shows a timing diagram of the activities of each capacitor matrix 61, 62, 66, 67 in the embodiment shown in FIG. 6, when switches $S_{i1}$, $S_{i2}$, $S_{i3}$, $S_{i4}$, $S_{q1}$, $S_{q2}$, $S_{q3}$ and $S_{q4}$, are used to switch the input signal polarity for every second charge sampling period (i.e. the downconversion local oscillator frequency is the inverse of the charge sampling period). The in-phase matrices 61, 62 alternate in state with respect to each other, while the activities of the quadrature matrices 66, 67 are out of phase by 90° with respect to the in-phase matrices 61, 62. This way the 90° phase shift is implemented as a phase shift in charge sampling periods unlike in FIG. 7, where the quadrature downconversion was performed with switches $S_{i1}$, $S_{i2}$, $S_{i3}$, $S_{i4}$, $S_{q1}$, $S_{q2}$, $S_{q3}$ and $S_{q4}$ and charge sampling in in-phase and quadrature branches could be performed without 90° phase shift. Alternatively, switches $S_{i1}$, $S_{i2}$, $S_{i3}$, $S_{i4}$, $S_{q1}$, $S_{q2}$, $S_{q3}$ and $S_{q4}$ can be omitted and the inversion of every second sample can be done in digital domain. So in this embodiment, the ADC acts as an IF ADC as shown in FIG. 1b.

Successive approximation ADCs according to embodiments of the present invention have relatively low power consumption. The conversion requires a relatively long time to perform, and long integration times during charge sampling are also preferred as the sinc-filtering is more efficient. It is possible, however, to increase the "effective sampling frequency", and hence the accuracy of the converter by connecting together N charge sampling SAR ADCs to construct an N-times interleaved ADC having an N-times larger effective sampling frequency.

By interleaving the converters, the downconverted signal can be digitised in more detail than with quadrature downconversion where signals with a 90° phase difference are converted into a digital signal. If an RF signal is downconverted with finer than the 90° phase resolution, downconversion from harmonics of the local oscillator frequency can be prevented, thus relaxing RF bandpass filtering requirements before downconversion. This type of frequency mixer is called a "harmonic rejection mixer".

Figure 9:
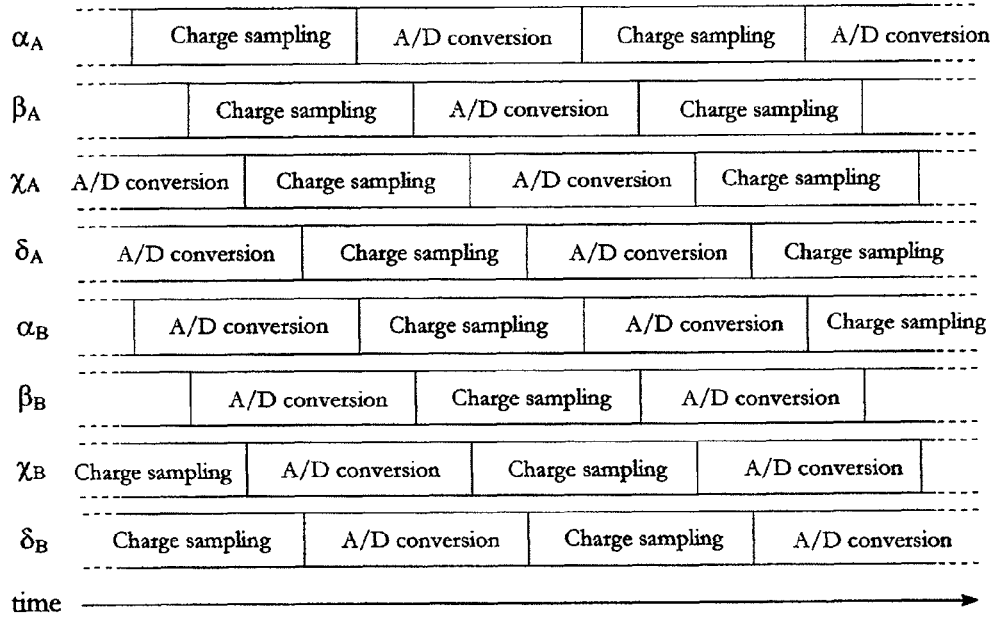
FIG. 9 is shows the activity of the capacitor matrices of a four-times interleaved ADC according to an embodiment of the present invention.

FIG. 9 shows an example of the activity of capacitor matrices in a four-times interleaved charge sampling ADC according to an embodiment of the present invention. For such an arrangement, four transconductance amplifiers, eight capacitor matrices (arranged as four pairs (α, β, χ, δ) of matrices labelled 'A' and 'B') and four comparators and control logic modules would be required in order to provide the interleaved A/D conversion. Each half of the capacitor matrix pairs operates alternately in charge-sampling and A/D conversion mode as described above, and the interleaving or staggering of the sampling periods between different pairs of matrices can be seen. The digitalised output signals are produced from each of the control logic signals in sequence.

If the samples labelled 'B' are inverted with respect to 'A' either by inverting the input current signal with switches or inverting output signals in digital domain, the ADC acts as an IF ADC downconverting a signal from the charge sampling frequency while performing bandpass filtering. However, if none of the samples is inverted, the ADC is an eight-times interleaved baseband ADC (as in FIG. 1a) that performs sinc-type lowpass filtering. The digital outputs of the interleaved converters can be combined together so that this block can combine the functions of the filters 7, 11 and the converters 8 and 12 shown in FIG. 1a.

In practice, a higher-order interleaved ADC is required to perform harmonic rejection mixing, and consequently a higher phase resolution is required. Alternatively, for harmonic rejection, only certain phase differences with respect to in-phase and quadrature signals are important and therefore some of the interleaved ADCs can be omitted thus saving silicon area and power.

A further advantage of using interleaved ADCs is that the performance of each receiver chain can be controlled individually, so that a multiradio receiver can have a high-performance and a low-performance chain, selected appropriately for the standard being used.

In a modification to the embodiments described, differential capacitor matrices can be used in place of the non-differential capacitors described. The differential capacitor matrices take two inputs, and take two outputs. The two inputs would be the $I_+$ and $I_-$ differential currents from the transconductance amplifier, and so a further input switch, operating in the same way as S3 in FIG. 2 described above, would be required in order to control the current routing. The output of the capacitor matrices would also be differential in nature, representing positive and negative versions of the sampled charge.

The circuit techniques according to the embodiments of the present invention are simple to port to new CMOS systems and scale well, as they can be constructed using CMOS analogue switches and matched unit capacitors. The capacitor matrices are used in the embodiments as both sampling capacitors and a converters in the ADC. Sampling rate and resolution can easily be controlled by modifications to the control logic. In addition, the circuits are energy efficient and are particularly suitable for wideband radio systems with moderate resolution specifications such as those anticipated to be used in 4G or Ultra-Wideband (UWB) interfaces.

The circuits are particularly advantageous for use in applications such as radio receivers having multiple standards, as parameters such as the clock frequency and filter notches can be controlled via software in the SAR controller in order to meet the required specifications, with no significant changes to the hardware being required. The position of the filter notches depends on the sampling frequency used in the A/D conversion, which can be controlled via appropriate selection of the frequency at which the switches controlling the inputs to the capacitor matrices are alternated. By appropriate control of the sampling frequency, the need for a separate filter is removed as the desired filtering function can be combined into the ADC.

In the circuits described, a significant amount of the required channel filtering can be performed in the digital domain after operation of the ADC, while the rest is done in RF or IF frequencies. The circuits therefore avoid analogue signal processing at low frequencies where it is increasingly more difficult to reach a high dynamic range because of the increase in flicker noise found with CMOS process scaling.

Although described with reference to a radio system, the ADC according to the present invention is potentially suitable for use in various systems where digitalisation of analogue signals is required, such as in mobile phones and other communications devices, computer systems, and sensing devices where processing is required to be performed on digital signals by microprocessor chips and the like.

The invention claimed is:

1. A method of converting an analogue signal to a digital signal, comprising:
    converting an input analogue voltage signal to a current signal;
    alternately applying the current signal to a first charge-storage and a second charge storage during a sampling period;
    performing approximation of a voltage derived from charge stored in the first charge storage while the current signal is applied to the second charge storage during the sampling period by determining one of a successively smaller range of voltages which corresponds to the derived voltage; and
    outputting a digital signal corresponding to the approximated voltage.

2. The method of claim 1, wherein the first charge storage is a first capacitor matrix and the second charge storage is a second capacitor matrix.

3. A method according to claim 1 comprising downconverting the current signal, in which the sampling period comprises at least one downconversion period.

4. A method according to claim 3 in which the signal downconversion is quadrature downconversion.

5. A method according to claim 3 in which the signal downconversion is performed at finer than 90° resolution by:
    applying the current signal to the first charge storage of each of a plurality of pairs of charge storages; and
    approximating the voltages derived from charge stored in each first charge storage while the current signal is applied to the respective second charge storage of each of the plurality of pairs of charge storages;
wherein the sampling periods associated with the pairs of charge-storage are out of phase with respect to each other.

6. A method according to claim 3 in which downconversion of the current signal is performed using switches for selecting one of two input currents of opposite polarity for application to the charge storage, the switches configured to alternate at the downconversion frequency.

7. A method according to claim 6 in which the current signal is inverted at the downconversion frequency.

8. A method according to claim 1 comprising downconverting the digital output signal.

9. A method according to claim 1 in which the approximation comprises comparing the voltage derived from the sampled charge with a reference value and updating the reference value in accordance with the result of the comparison.

10. A method according to claim 1 in which the reference value is a binary number and the updating of the reference value comprises updating successively less significant bits.

11. A method according to claim 1 wherein the sampling comprises at least one of bandpass filtering of the input signal and low pass filtering of the downconverted input signal.

12. A method according to claim 11 in which the transfer function of the filter comprises notches.

13. A method according to claim 12 wherein the filtering is configured as antialiasing filtering.

14. A method according to claim 1 in which the approximation comprises dithering.

15. An apparatus for performing analogue-to-digital conversion, comprising:
    one or more transconductance amplifiers for converting an input analogue voltage signal to a current signal;
    a first charge storage for storing charge carried by the current signal during a sampling period;
    a second charge storage for storing charge carried by the current signal during the sampling period;
    a voltage approximator for performing approximation of a voltage derived from the charge stored in the charge storage while the current is applied to the second charge storage during the sampling period by determining one of a successively smaller range of voltage levels which corresponds to the derived voltage; and
    an output for outputting a digital signal corresponding to the approximated voltage.

16. An apparatus according to claim 15 wherein the voltage approximator comprises a controller and a register for storing a value corresponding to the approximation.

17. An apparatus according to claim 16 wherein the apparatus further comprises a comparator for comparing a reference voltage corresponding to the stored value with the voltage derived from charge stored by the charge storages, the value stored in the register arranged to be updated by the controller in accordance with the result of the comparison.

18. An apparatus according to claim 17 comprising at least one downconverter for downconverting the current signal.

19. An apparatus according to claim 18 in which the signal downconversion is quadrature downconversion.

20. An apparatus according to claim 18 in which the downconverter comprises at least one switch or an analogue multiplexer.

21. An apparatus according to claim 18 in which the controller is arranged to generate a clock signal for synchronizing the downconverter with the voltage approximator.

22. An apparatus according to claim 21 wherein the clock signal is controlled such that the apparatus performs at least one of bandpass filtering of the input signal and low-pass filtering of the downconverted input signal.

23. An apparatus according to claim 22 wherein the filtering is arranged as antialiasing filtering.

24. An apparatus according to claim 15 wherein the charge storage comprises a capacitor matrix having at least two capacitors arranged in parallel.

25. An apparatus according to claim 24 wherein the capacitors of the matrices have capacitances arranged in a binary-weighted relationship.

26. An apparatus according to claim 25 in which a dithering signal is applied to the sampled input signal using charge stored by one or more of the capacitors in each matrix.

27. An apparatus according to claim 17 comprising a plurality of pairs of charge storages, wherein current is arranged to be applied to a first charge storage of each pair in sequence, and approximation of a voltage derived from charge stored by the first charge storage of each pair is arranged to be performed while the current signal is applied to the second charge storage of each pair.

28. An apparatus according to claim 27 in which sampling periods associated with the pairs of charge storages are arranged to be out of phase with respect to each other.

29. An apparatus according to claim 15 wherein the transconductance amplifier(s) are arranged to produce a differential current output.

30. A radio comprising: an antenna for receiving a radio signal; and the apparatus according to claim 15, arranged to perform analogue to digital conversion of the radio signal received by the radio.

31. A mobile phone comprising: an antenna for receiving a communications signal; and the apparatus according to claim 15, arranged to perform analogue to digital conversion of the communications signal received by the phone.

* * * * *